(12) United States Patent
Sivero et al.

(10) Patent No.: US 12,431,178 B2
(45) Date of Patent: Sep. 30, 2025

(54) LOW-VOLTAGE SENSE AMPLIFIER FOR READING A STATE-PROGRAMMABLE MEMORY ELEMENT

(71) Applicant: Ferroelectric Memory GmbH, Dresden (DE)

(72) Inventors: Stefano Sivero, Comun Nuovo (IT); Alessandro Palludo, Milan (IT); Fabio Tassan Caser, Dresden (DE)

(73) Assignee: Ferroelectric Memory GmbH, Dresden (DE)

( * ) Notice: Subject to any disclaimer, the term of this patent is extended or adjusted under 35 U.S.C. 154(b) by 180 days.

(21) Appl. No.: 18/486,206

(22) Filed: Oct. 13, 2023

(65) Prior Publication Data
US 2025/0124961 A1 Apr. 17, 2025

(51) Int. Cl.
*G11C 11/22* (2006.01)
*G06F 3/06* (2006.01)

(52) U.S. Cl.
CPC ........ *G11C 11/2273* (2013.01); *G06F 3/0625* (2013.01); *G06F 3/0634* (2013.01); *G06F 3/0673* (2013.01); *G11C 11/221* (2013.01)

(58) Field of Classification Search
CPC . G11C 11/2273; G11C 11/221; G06F 3/0625; G06F 3/0634; G06F 3/0673
USPC ................................ 365/145, 205
See application file for complete search history.

(56) References Cited

U.S. PATENT DOCUMENTS

| | | | |
|---|---|---|---|
| 6,445,606 B1 * | 9/2002 | Khoury | G11C 17/16 365/96 |
| 10,978,129 B1 | 4/2021 | Müller | |
| 11,049,541 B2 | 6/2021 | Müller | |
| 11,081,159 B1 | 8/2021 | Jähne | |
| 11,101,291 B2 | 8/2021 | Mennenga | |
| 11,158,361 B2 | 10/2021 | Müller | |
| 11,189,331 B1 | 11/2021 | Benoist | |
| 11,195,589 B1 | 12/2021 | Ocker | |
| 11,289,145 B2 | 3/2022 | Ocker | |
| 11,309,034 B2 | 4/2022 | Mennenga | |
| 11,309,792 B2 | 4/2022 | Iqbal | |
| 11,309,793 B2 | 4/2022 | Iqbal | |
| 11,335,391 B1 | 5/2022 | Ocker | |
| 11,380,400 B2 | 7/2022 | Noack | |
| 11,380,695 B2 | 7/2022 | Ocker | |
| 11,387,254 B2 | 7/2022 | Noack | |

(Continued)

*Primary Examiner* — Michael T Tran
(74) *Attorney, Agent, or Firm* — Synergy IP Group AG; Natalie A. Albrecht (57) ABSTRACT

Disclosed herein are devices, methods, and systems for operating a sense amplifier comprising a plurality of transistors connected in a cascode configuration. The plurality of transistors are configured to sense, in a read operation mode, a switching signal from the state-programmable memory element, and to apply, in a write operation mode, a programming voltage level to the state-programmable memory element. The plurality of transistors are configured to receive a supply voltage at, in the read operation mode, a first supply voltage level that is lower than the programming voltage level and at, in the write operation mode, the programming voltage level, and to operate the sense amplifier in the read operation mode and the write operation mode with no more than a maximum operational voltage level across each of the plurality of transistors that is less than the programming voltage level.

20 Claims, 5 Drawing Sheets

(56) References Cited

U.S. PATENT DOCUMENTS

| | | |
|---|---|---|
| 11,393,518 B1 | 7/2022 | Ocker |
| 11,393,832 B2 | 7/2022 | Mennenga |
| 11,437,402 B2 | 9/2022 | Noack |
| 11,443,792 B1 | 9/2022 | Iqbal |
| 11,475,935 B1 | 10/2022 | Ocker |
| 11,508,426 B1 | 11/2022 | Ocker |
| 11,508,428 B2 | 11/2022 | Noack |
| 11,508,756 B2 | 11/2022 | Mennenga |
| 11,527,551 B2 | 12/2022 | Ocker |
| 11,594,271 B2 | 2/2023 | Noack |
| 11,594,542 B2 | 2/2023 | Polakowski |
| 11,605,435 B2 | 3/2023 | Schenk |
| 11,610,903 B2 | 3/2023 | Schenk |
| 11,626,164 B2 | 4/2023 | Noack |
| 11,682,461 B2 | 6/2023 | Mennenga |
| 11,688,447 B2 | 6/2023 | Ocker |
| 2002/0085436 A1* | 7/2002 | Chang ............... G11C 11/5642 365/200 |
| 2003/0002334 A1* | 1/2003 | Ho Chang ......... G11C 11/5628 365/185.03 |
| 2011/0058423 A1* | 3/2011 | Fujimura ............... G11C 16/12 365/185.17 |
| 2011/0235403 A1* | 9/2011 | Kang .................... G11C 29/50 365/148 |
| 2012/0307561 A1* | 12/2012 | Joo ....................... G11C 16/10 365/185.17 |
| 2013/0163348 A1* | 6/2013 | Yoon .................... G11C 29/026 365/189.05 |
| 2015/0243352 A1* | 8/2015 | Park ................... G11C 13/0004 365/163 |
| 2019/0130970 A1* | 5/2019 | Carissimi ........... G11C 13/0069 |
| 2020/0202964 A1* | 6/2020 | Sako ..................... G11C 16/24 |
| 2021/0125677 A1* | 4/2021 | Cho ..................... G11C 17/18 |
| 2021/0247910 A1* | 8/2021 | Kim ..................... G06F 3/0611 |
| 2021/0319839 A1* | 10/2021 | Antonyan ........... G11C 11/1675 |
| 2021/0375345 A1* | 12/2021 | Wei ..................... H10D 30/701 |
| 2022/0122995 A1 | 4/2022 | Ocker |
| 2022/0122996 A1 | 4/2022 | Ocker |
| 2022/0139932 A1 | 5/2022 | Polakowski |
| 2022/0139934 A1 | 5/2022 | Müller |
| 2022/0139937 A1 | 5/2022 | Müller |
| 2022/0262819 A1* | 8/2022 | Kim ..................... H10B 41/41 |
| 2022/0270659 A1 | 8/2022 | Ocker |
| 2022/0374202 A1 | 11/2022 | Villa |
| 2022/0376114 A1 | 11/2022 | Müller |
| 2023/0041759 A1 | 2/2023 | Noack |
| 2023/0046259 A1 | 2/2023 | Iqbal |
| 2023/0135718 A1 | 5/2023 | Minh |
| 2023/0170029 A1 | 6/2023 | Sivero |
| 2023/0189531 A1 | 6/2023 | Müller |
| 2023/0189532 A1 | 6/2023 | Müller |
| 2023/0223066 A1 | 7/2023 | Müller |
| 2023/0247842 A1 | 8/2023 | Müller |
| 2023/0284454 A1 | 9/2023 | Ocker |
| 2023/0335174 A1 | 10/2023 | Kuzmanov |
| 2023/0360684 A1 | 11/2023 | Sivero |
| 2023/0371268 A1 | 11/2023 | Müller |
| 2023/0402083 A1 | 12/2023 | Schenk |
| 2024/0032305 A1 | 1/2024 | Kashir et al. |
| 2024/0032306 A1 | 1/2024 | Ocker |
| 2024/0032307 A1 | 1/2024 | Müller et al. |
| 2024/0127876 A1 | 4/2024 | Ocker |
| 2024/0172451 A1 | 5/2024 | Schenk |
| 2024/0185903 A1 | 6/2024 | Sivero |
| 2024/0265959 A1 | 8/2024 | Sivero et al. |
| 2024/0312507 A1 | 9/2024 | Palludo et al. |
| 2024/0337681 A1 | 10/2024 | Bathon et al. |

* cited by examiner

LOW-VOLTAGE SENSE AMPLIFIER FOR READING A STATE-PROGRAMMABLE MEMORY ELEMENT

TECHNICAL FIELD

This disclosure relates to non-volatile memories that include state-programmable memory elements for storing information, and, in particular to sense amplifiers used for sensing voltages provided to the sense amplifier when reading the state-programmable memory elements of the memory.

BACKGROUND

Non-volatile memories allow for retaining stored information in the memory even after external power to the memory has been removed. Memories are typically formed from a number of memory cells, where each memory cell stores digital (e.g., binary) information (e.g., each memory cell may be written to a value representing a "0" or to a value representing a "1"). Among other components, memory cells may include a state-programmable memory element (e.g., a ferroelectric memory element such as a ferroelectric capacitor) that is capable of retaining the written information based on a programmed state that is retained even after its power source has been removed (e.g., a remanent state). Then, the information stored in the memory cell may be read out at later time by reading-out the programmed state of the state-programmable memory element.

To do this, a read voltage is usually provided across the state-programmable memory element during a read operation, where the read voltage is sufficient to program the state-programmable memory element to a remanent state, and then a sensing circuit is used to sense (e.g., via a sense amplifier) the resulting switching charge developed to the sensing circuit by the read operation to determine the read state. The read state may be determined from the switching charge developed when the state-programmable memory element changes states by comparing a voltage developed by the switching charge to a predetermined threshold voltage, where little to no switching charge will be developed if the state-programmable memory element has not switched states and a larger switching charge will be developed if the state-programmable memory element has switched states. Because the read operation is "destructive" in that it programs the state-programmable memory element to a predetermined state, the read-out state may need to be written back to the state-programmable memory element in a write-back operation. This means that the sense amplifier, over the course of the read operation and write-back operation, may be exposed to the full read voltage needed to program the state-programmable memory element to one of its remanent states, where the full read voltage may be larger than that developed by the switching charge. As a result, the sense amplifier may need to utilize transistors that operate at relatively high voltages to ensure that the sense amplifier can handle and is not damaged when exposed to the large swing of voltages. However, the use of high voltage transistors in a sense amplifier may be inefficient from both a power-consumption perspective and a real-estate perspective.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices. However, it may be understood that aspects described in connection with methods may similarly apply to the devices, and vice versa.

In non-volatile memories that use state-programmable memory elements, a sense amplifier is typically used to determine the programmed state based on a switching charge developed as a voltage to the sense amplifier, where the switching charge depends on the programmed state of the state-programmable memory element before the read operation. As used throughout this disclosure, a state of a state-programmable memory element may be described as "remanent" where the state-programmable memory element it is capable of retaining its programmed state even when it is not connected to a power source. As also used throughout, the current remanent state to which the state-programmable memory element has been set may be referred to as the "stored" state, the "written" state, or the "programmed" state. As should be understood, when referring to a state-programmable memory element, the terms "write," "store," or "program" are used generically to refer to setting the remanent state of state-programmable memory element. As is understood, the term "voltage" may be used herein with respect to "a bit line voltage", "a word line voltage," "a plate line voltage," and the like. The "voltage across" a component may be used herein to denote a voltage drop from a node on one side of a component (e.g. one side of a capacitor) to a node on the other side of the component (e.g., the other side of the capacitor).

When a state-programmable memory element includes ferroelectric material (e.g., a ferroelectric capacitor), the remanent state is understood as referring to a remanent polarization state that is set by applying a particular voltage across the element that is sufficient to set a corresponding polarization state, where, once set, the remanent polarization state is retained by the element even when the voltage across the element has been removed (e.g., it is remanently-polarizable). Once such an element has been state-programmed to a remanent state, it generally retains the programmed state until it is re-programmed by applying a voltage across it that is sufficient to program the element to a (e.g., new) remanent state.

As should be understood, a polarization capability of a state-programmable memory element (e.g., remanent polarization capability, e.g., non-remanent spontaneous polarization capability) may be analyzed using capacity measurements (e.g., a spectroscopy), e.g., via a static (C-V) and/or time-resolved measurement or by polarization-voltage (P-V) or positive-up-negative-down (PUND) measurements. Another method for determining a polarization capability of a state-programmable memory element may include transmission electron microscopy, e.g., an electric-field dependent transmission electron microscopy.

As noted above, in a typical read operation, a read voltage is applied across the state-programmable memory element(s), where the read voltage is sufficient to program the state-programmable memory element(s) to a remanent state (e.g., the "programming voltage" or "operational voltage"). Then, a sensing circuit is used to sense the resulting charge developed by the read operation to determine the read state. The resulting charge may be, in a typical voltage sensing scheme, developed as a voltage at the input of a sense amplifier that compares the sensed voltage to a pre-defined voltage to determine which remanent state the state-programmable memory element had been programmed before the read operation.

Because the read voltage applied across the state-programmable memory element during the read operation needs to be sufficient to program the state-programmable memory element to one of its remanent states, the read operation may be "destructive" in that it may switch the programmed state of the state-programmable memory. Thus, after the sensing circuit has determined the read-out state (e.g., the remanent state associated with a "0" or the remanent state associated with a "1") that was read during the read operation, the state-programmable memory element may need to be re-programmed to is original remanent state (also called a "write-back" operation or "memory refresh"). In the write-back operation, the sense amplifier may be configured to re-program the read-out state by applying a voltage sufficient to program the state-programmable memory element to its original remanent state.

Because the sense amplifier may be exposed not only to the voltage developed by the switching charge but may also need to supply the full read voltage needed to program the state-programmable memory element, the sense amplifier may need to be dimensioned for relatively high voltages (e.g., utilize transistors that operate at relatively high voltages). This is because the full read voltage may need to be set to a value that is higher than the voltage developed by the switching charge and higher than the logic voltage levels used by the memory (e.g., VDD), in order to ensure that a sufficient voltage is provided to the state-programmable memory element for a successful read operation. As should be understood, different state-programmable memory elements (e.g., a ferroelectric element (e.g., a remanently-polarizable capacitor (e.g., a ferroelectric capacitor))) may have different threshold voltages at which the voltage across the element is sufficient to program a remanent state (e.g., to "erase," "write," or "program" one of the remanent polarization states), due to the passage of time, amount of usage, operating temperature, type of materials used (e.g., for the ferroelectric film), the type of memory technology, variations in manufacturing, etc. Thus, the operational voltage (e.g., the "programming voltage," or the voltage provided across the state-programmable memory element during a read operation or a write operation to program a remanent state) needs to be higher than the threshold voltage and may thus be higher than VDD.

Figure 1:
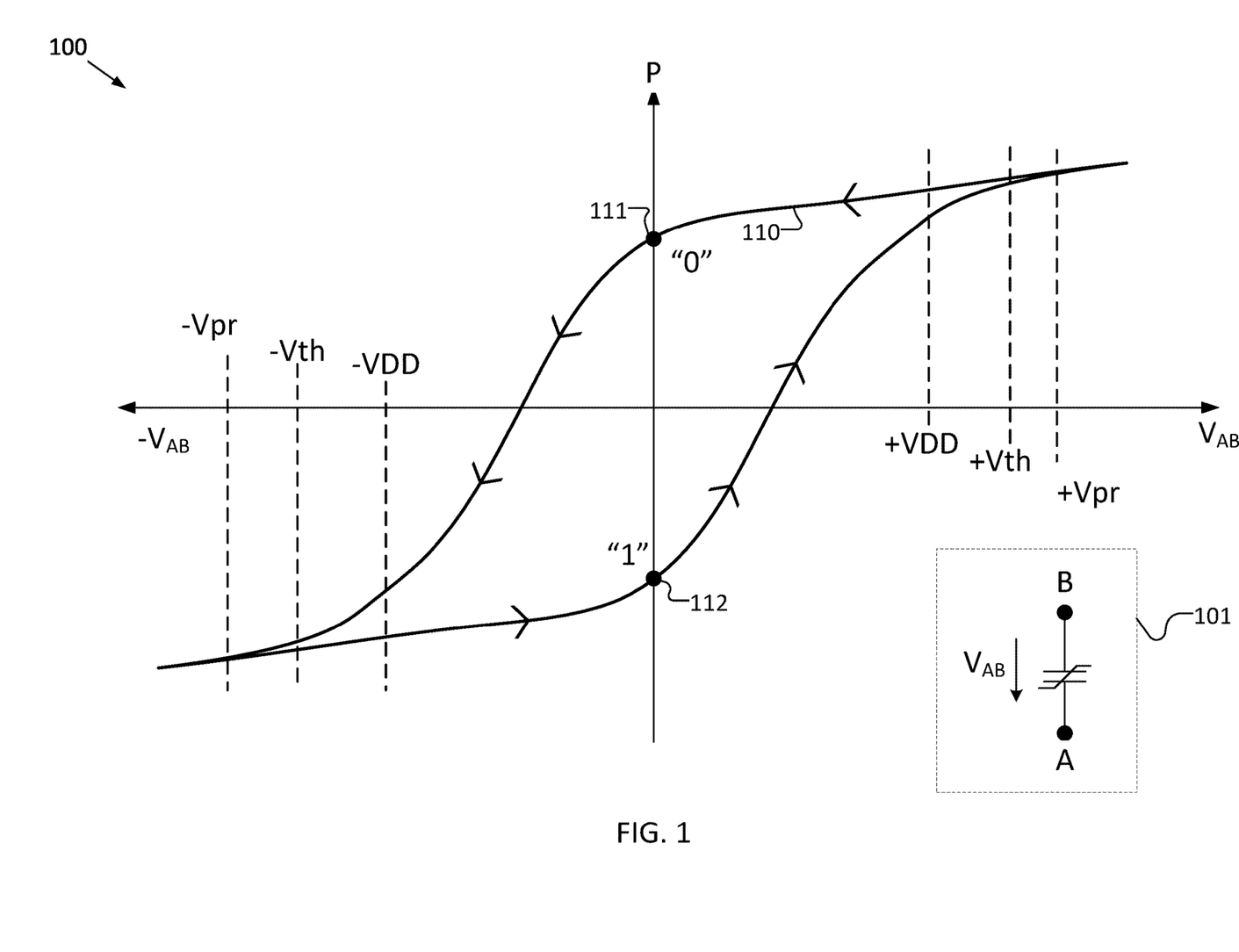
FIG. 1 shows an exemplary graph of a typical hysteresis curve associated with a state-programmable memory element, which shows polarization as a function of the voltage applied across it.

As shown in FIG. 1 for example, the operational voltage or programming voltage (Vpr) may need to be higher than VDD to ensure that voltage across the element is above the threshold voltage sufficient to program the remanent state. FIG. 1 shows an example graph 100 of the typical hysteresis curve 110 associated with a state-programmable memory element 101 (e.g., a ferroelectric capacitor). Graph 100 shows polarization (P) as a function of the voltage across the state-programmable memory element 101 ($V_{AB}$), where +Vth is the threshold voltage above which the state-programmable memory element 101 is programmed to remanent polarization state 111 (representing, for example, a bit of digital information with a value of "0") and where −Vth is the threshold voltage above which the state-programmable memory element 101 is programmed to remanent polarization state 112 (representing, for example, a bit of digital information with a value of "1"). In the example shown in FIG. 1, the magnitude of VDD is below Vth, so the magnitude of the operational voltage or programming voltage (Vpr) may need to be higher than VDD to reliably program the state-programmable memory element 101 to one of its remanent polarization states 111 or 112. Thus, a sense amplifier may need to utilize transistors that can handle the full operational/programming voltage.

However, a sense amplifier made from high voltage transistors—ones that are dimensioned to handle voltages across them that are as high as the programming voltage/operational voltage of the state-programmable memory element—may be inefficient from a power-consumption perspective (e.g., higher voltage transistors consume more power) and from a real-estate perspective (e.g., they take up too much space on the chip). As discussed in more detail below, a sense amplifier is disclosed herein that may be made from low voltage transistors that need not handle voltages as high as the programming voltage/operational voltage of the state-programmable memory element. Even while using low voltage transistors, however, the sense amplifier disclosed below may supply a programming voltage/operational voltage that is above VDD without exposing the low voltage transistors to the full range of the higher programming voltage/operational voltage. Thus, the disclosed sense amplifier may maintain write-reliability while being more efficient from a power-consumption and from a real-estate perspective.

Figure 2:
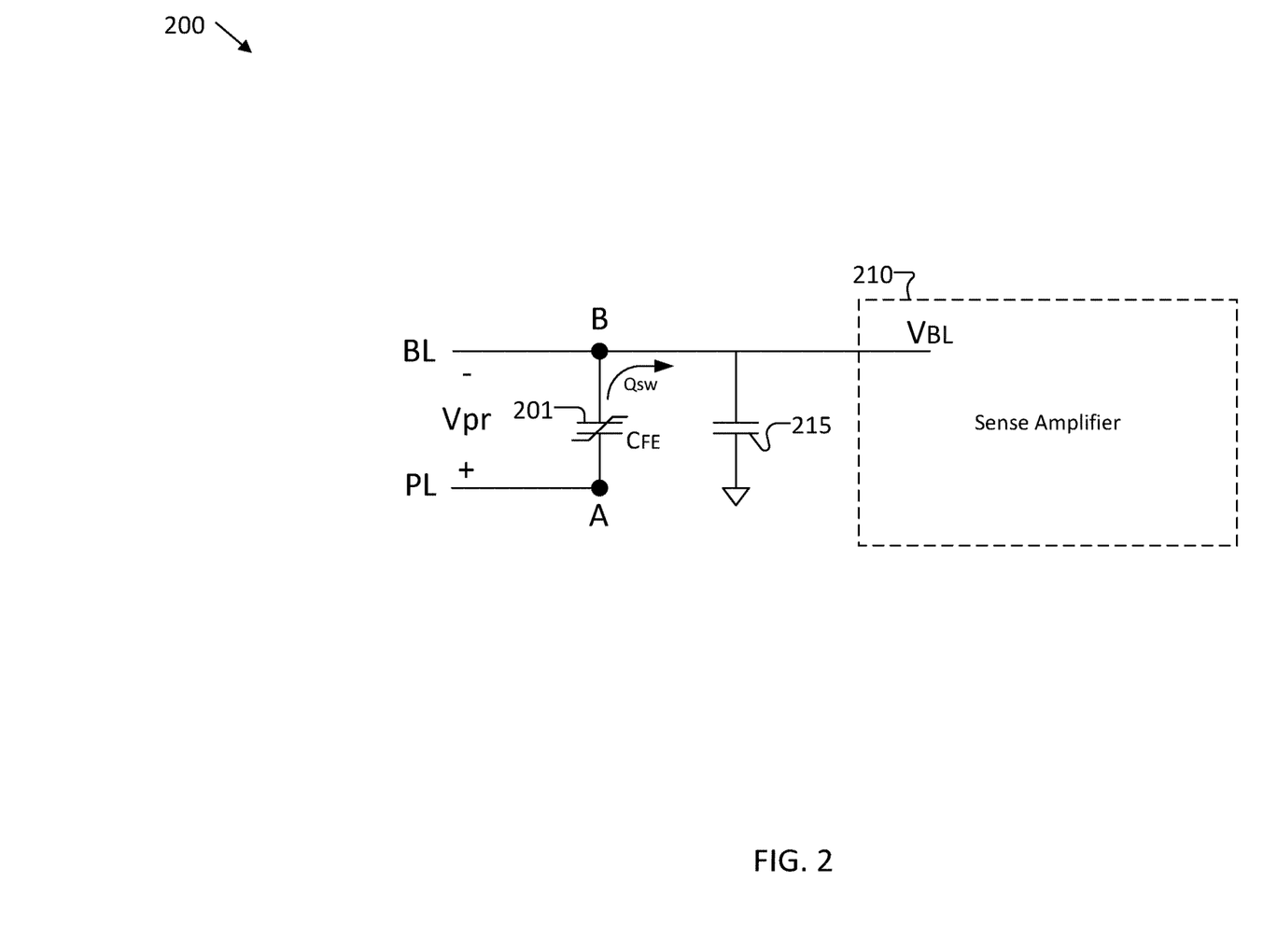
FIG. 2 illustrates an exemplary state-programmable memory element connected to a sense amplifier for sensing, for example on a bit line, a voltage from a switching charge developed by a state-programmable memory element during a read operation.

FIG. 2 shows a circuit diagram 200 of a sense amplifier 210 connected to a state-programmable memory element 201 (e.g., a ferroelectric capacitor). During a read operation, a read voltage (e.g., the programming voltage, Vpr) is provided across the state-programmable memory element 201 (e.g., $V_{AB}$). The programming voltage across the state-programmable memory element 201 develops a switching charge ($Q_{SW}$) that may be accumulated, for example, across an input capacitance (e.g., capacitor 215) to develop a voltage that is used by a sense amplifier 210 to compare the voltage to a threshold switching voltage (e.g., in a voltage sensing scheme) to determine which remanent state the state-programmable memory element 201 was programmed to before the read operation.

In this example, the state-programmable memory element 201 is connected to a bit line (BL) and a plate line (PL) on opposite sides of the state-programmable memory element 201, where the sense amplifier 210 is also connected to the BL. The programming voltage (Vpr) is then applied across the state-programmable memory element by first discharging the BL to zero volts and then applying the programming voltage to the PL to develop a switching charge that is sensed by the sensing circuit. As should be appreciated, while only one state-programmable memory element 201 and its corresponding sense amplifier 210 is shown in FIG. 2, a memory typically includes a number of individual memory cells that may be organized into groupings of cells, where each cell may be individually addressed but have a common control scheme for biasing the cells via control lines such as bit lines (e.g., for operating the cells grouped in the same column), word lines (e.g., for operating cells grouped in the same row), and/or plate lines (e.g., for operating cells grouped to as to share a common node such as a same "plate"). Thus, depending on the memory's architecture, sense amplifier 210 may be connected to a bit line and/or plate line that are common to multiple state-programmable memory elements in the same group. In addition, the sense amplifier 210 may be connected to multiple bit lines and/or plate lines, for example, in a differential configuration for different sets of lines (e.g., one set of even bit lines paired with a set of odd bit lines).

Sense amplifier 210 may be a sense amplifier made from low voltage transistors that need not, individually, be capable of handling voltages as high as the programming voltage/operational voltage needed to program a state-programmable memory element (e.g., the programming voltage needed to read and/or write a remanent state of the state-programmable memory element 101, 201, discussed above with respect to FIG. 1 and FIG. 2). Although sense amplifier 210 may be made from low voltage transistors, sense amplifier 210 may be capable of supplying a voltage (e.g., during a write operation or a memory refresh) that is as high as the programming voltage/operational voltage (which may be higher than VDD).

Figure 3:
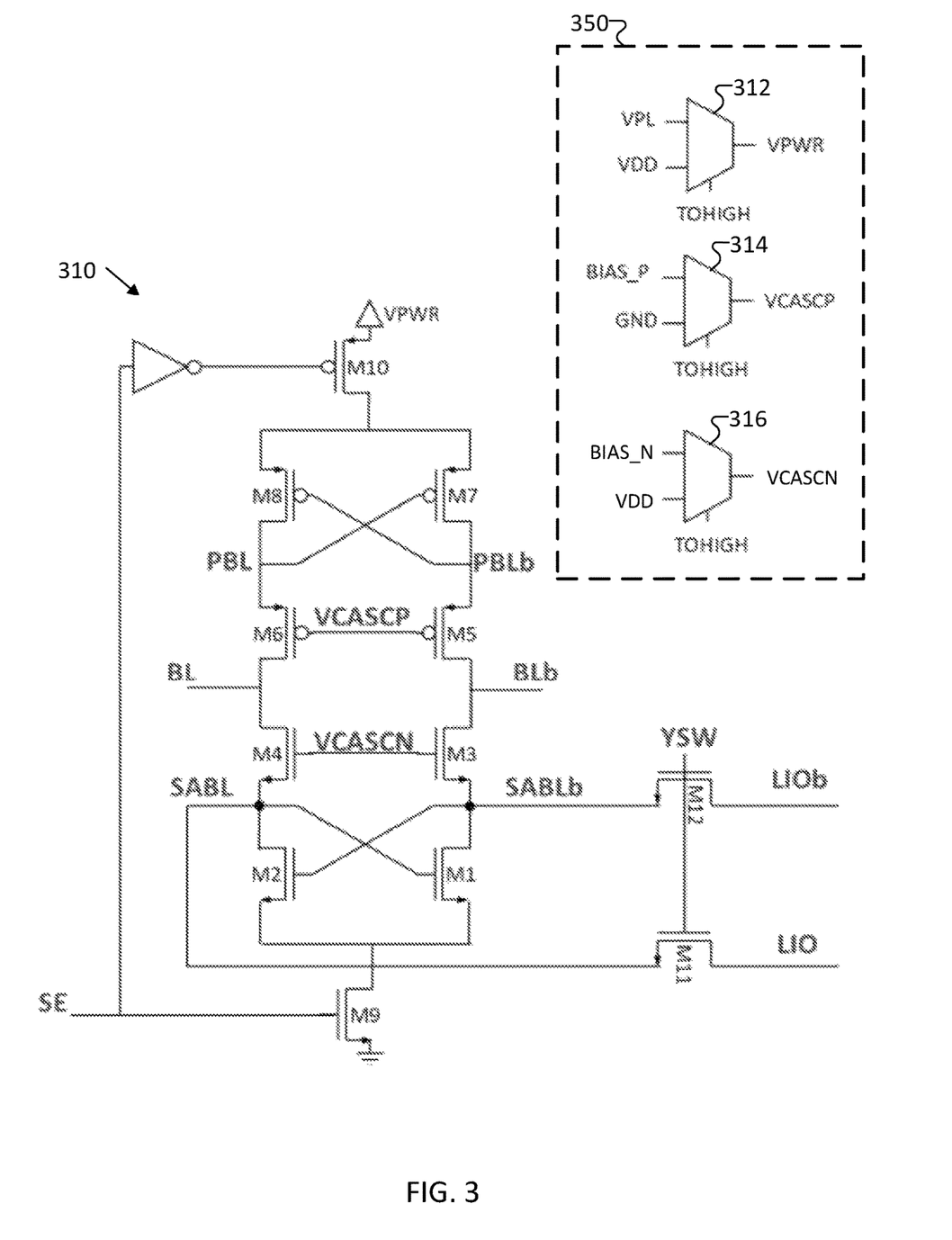
FIG. 3 depicts an exemplary sense amplifier that may be used to sense, for example on a bit line, a voltage from a switching charge developed by a state-programmable memory element during a read operation.

FIG. 3 shows an example implementation of sense amplifier 210 that may utilize low voltage transistors (e.g. for transistors M1 through M8, M9, M11, and M12). Nevertheless, even with low voltage transistors, the sense amplifier 310 may still be able to supply, on the BL, a programming voltage/operational voltage that is higher than VDD, without exposing the transistors of the sense amplifier 310 to a voltage difference across an individual transistor that is as high as the programming voltage/operational voltage (e.g., if higher than VDD). The sense amplifier 310 may have, for example, a dual-stage, differential cascode configuration, where the supply voltage (VPWR) and the intermediate voltages (VCASCP, VCASCN) (also called intermediate supply voltages) are configurable, as discussed in more detail below, to different voltage levels (e.g., by switches 312, 314, and/or 316) during the read operation and write-back (or write) operation (e.g., the voltage level may depend on whether a mode of operation (operation mode) is the read operation or the write-back (or write) operation). As should be understood, sense amplifier 310 may be implemented with differential pairs, as shown in FIG. 3. However, sense amplifier 310 may also be single-ended. As should also be understood, while M10 may be a high voltage transistor to handle voltages across it that are as high as VPL, M10 may be a global transistor that is shared by multiple sense amplifiers.

In the exemplary configuration of FIG. 3, the sense amplifier 310 has differential paired lines for operating two different arrays of memory cells (e.g., two groups of state-programmable memory elements, where each group shares a common bit line). Thus, each signal (for a first group of the two groups) may have a corresponding "b" signal (for the second group of the two groups) that is used as a reference for the differential pair and vice versa. For example, when reading on the bit line BL connected to (e.g., a subset of) memory cells in the first group, the "b" signal, BLb, connected to the correspondent (e.g., subset of) memory cells in the second group, is the reference. Similarly, when reading on the "b" bit line BLb, the bit line, BL, is the reference. This same type of pairing exists for the other labeled nodes in sense amplifier 310, including the pair of nodes labeled PBL/PBLb, the pair of nodes labeled SABL/SABLb, and the pair of nodes labeled LIO/LIOb. In the exemplary configuration of FIG. 3, transistors M5 and M6 limit the low voltage node (at PBL/PBLb) to the voltage of VCASCP plus the threshold voltage of M5/M6 ($V_{th\_p}$). Transistors M3 and M4 limit the high voltage node (at SABL/SABLb) to the voltage of VCASCN minus the threshold voltage of M3/M4 ($V_{th\_n}$). VCASCP and VCASCN are global voltages and are typically intermediate voltages compared to VPL (e.g., voltages that are typically between ground (GND) and VPL).

The sense amplifier 310 may operate using a supply voltage (VPWR) and be enabled by a sense enable signal SE provided to the sense amplifier 310. In response to receiving an SE signal to enable the sense amplifier 310 (e.g., the SE signal is driven to VDD), transistor M10 is switched on to connect VPWR to the one side of the sense amplifier 310 (e.g., at transistors M8 and M7 of the pull-up stage), and transistor M9 is switched on to connect the other side of the sense amplifier 310 (e.g., at transistors M1 and M2 of the pull-down stage) to ground. As should be understood, to the extent M10 is a high power transistor dimensioned to operate with a supply voltage as high as VPL, the SE signal may need to be level-shifted before being provided to the gate of M10, whereby the level-shifted SE signal (when SE is at zero) is high enough to switch off M10. Such a level-shifter may be located between the inverter and the gate of M10, or, if the inverter is also dimensioned for and supplied by a voltage as high as VPL, the level-shifter may be located before the inverter.

Control circuitry 350 may be used to select, based on a voltage selection control signal (e.g., TOHIGH), the supply voltage and the intermediate voltage (VCASCP) of the sense amplifier 310. For example, switch 312 may control, based on control signal TOHIGH, whether to provide VPL or VDD as the supply voltage to the sense amplifier 310, where VPL is the programming voltage/operating voltage of the state-programmable memory element that may be higher than VDD. Switch 314 may control, based on voltage selection control signal TOHIGH, whether to provide ground or an intermediate bias voltage (BIAS_P) (e.g., a voltage between ground and VPL) to VCASCP. Switch 316 may control, based on voltage selection control signal TOHIGH, whether to provide VDD or an intermediate bias voltage (BIAS_N) (e.g., a voltage between ground and VPL) to VCASCN. In this manner, the voltage across any given transistor remains less than the full value of VPL. As should be appreciated, while control circuitry 350 has been depicted as three switches 312, 314, and 316, any type of selection circuitry may be used to select appropriate voltages in response to a voltage selection control signal. In addition, as should be appreciated, the control circuitry 350 may be global to the memory, meaning that the memory by operate the control circuitry 350 (e.g., via the TOHIGH control signal) to select and provide the supply voltage (VPWR), VCASCP, and VCASCN as global voltages to multiple sense amplifiers of the memory. A memory controller may provide the control signal TOHIGH to the control circuitry 350 and the control signal may depend on the current mode of operation of the sense amplifier 310 (e.g., whether the operation mode is the read operation or the write operation) determined by the memory controller. Thus, the memory controller may define the control signals to set the operation mode of the sense amplifier 310.

For example, consider the case where VDD is 1 V and the state-programmable memory element requires an operational or programming voltage (VPL) of 2 V to reliably set the programmed state of the state-programmable memory element during a read and/or write operation. Thus, the programming voltage, VPL, is set to 2 V. During the read operation, the plate line is typically raised to VPL (in this example, 2 V) and kept at VPL to read out the information from the cell. Thus, with the plate line at VPL, the voltage across the state-programmable memory element is VPL when the bit line is at zero volts (GND) and the voltage across the state-programmable memory element is zero when the bit line is at VPL. Keeping the plate line at VPL during the read out ensures that writing of a "1" takes place only after the plate line is lowered to GND.

BIAS_P may be set to 0.8 V, BIAS_N may be set to 1.2 V, and low power transistors may be used that have a threshold voltage of 0.5 V ($V_{th\_n}$ and $V_{th\_p}$) with a maximum allowable voltage across the transistor of less than 2 V (e.g., 1 to 1.5 V). When writing a "1," for example, the BL may be biased to VPL (and thus the BLb is biased to ground). When writing a "0," the BL may be biased to ground (and thus the BLb is biased to VPL). When writing a "1", none of M1, M2, M3, and M4 (e.g., the N-type portion of the sense amplifier 310) will see a voltage a voltage of VPL across the transistor. If BL=VPL, then SABL=VCASCN−$V_{th\_n}$=0.7 V. BLb=0 V and SABLb=0 V. The maximum voltage between drain and source of M2 and M1 (Vds,max) and the maximum voltage between gate and drain/source of M2 and M1 (Vgs,max) is SABL=0.7 V. The maximum voltage between drain and source of M3 and M4 (Vds,max) is BL−SABL=1.3 V and the maximum voltage between gate and drain/source of M3 and M4 (Vgs,max) is VCASCN−SABLb=1.2 V. Thus, none of M1, M2, M3, and M4 see a voltage across it that is as high as VPL and the max voltage across each transistor is within the safe limit of 1.3V when writing the state-programmable memory element.

In the P-type portion of the sense amplifier 310, when reading a "1," BL=VPL and PBL=VPL. BLb=0 V and PBLb=VCASCP+$V_{th\_p}$=1.3 V. The maximum voltage between drain and source of M7 and M8 (Vds,max) and the maximum voltage between gate and drain/source of M7 and M8 (Vgs,max) is VPL−PBLb=0.7 V. The maximum voltage between drain and source of M5 and M6 (Vds,max) is PBLb−BLb=1.3 V and the maximum voltage between gate and drain/source of M5 and M6 (Vgs,max) is BL−VCASCP=1.2 V. Thus, none of M5, M6, M7 and M8 see a voltage across it that is as high as VPL when writing the state-programmable memory element and the max voltage across each transistor is within the safe limit of 1.3V. The sense amplifier 310 is therefore safe when considering other combinations of voltage of VCASCN and VCASCP that are between ground and VPL.

Sense amplifier 310 may experience reduced performance (e.g., in terms of speed) if the value of VPL is relatively low (e.g., 1 V, which could be due to reliability, testing, age, temperature tracking, etc.). This is because if sense amplifier 310 operates with a smaller difference between its supply power (VPWR) and ground, the result is a slower flip of the latch due to the M5, M6, M7, and M8 operating near their threshold levels.

A slower flip of the latch may also occur during a data-in operation. The data-in operation is where a new state is to be written to state-programmable memory element and therefore, the latch of the sense amplifier must be provided with the new data that is to be written to state-programmable memory element. In the example of FIG. 3, this may be done over the LIO/LIOb data-in lines that are controlled by YSW. To write new data into the latch of the sense amplifier 310, LIO/LIOb are driven with DATA/DATAb, YSW is enabled, and SABL/SABLb are overwritten. For example, if overwriting a "1" with new data of "0," the BL will be at VPL, BLb will be at GND, and the goal of the data-in operation is to flip the content of the two lines. To flip the two lines, LIO is biased to GND, LIOb is biased to VDD, and YSW is enabled by raising it to VDD. As a result, SABL is discharged to ground and SABLb is driven to VDD−$V_{th\_n}$ (because YSW is enabled and within the 0 to VDD range). BL is discharged through M4 to 0 V. M7 is switched on and PBLb rises, turning on M5, which charges BLb to VPL. In the case where VPL is low, M5 may be turned on too slowly because PLBb−VCASCP is not high enough. Thus, the data-in operation may have slow performance when VPL is low.

To avoid slow performance, sense amplifier 310 may be configured to operate (e.g., by a memory controller that provides the control signals to the control circuitry 350) with a supply voltage of VDD (e.g., via switch 312 to set VPWR to VDD) during times when the higher voltage (VPL) is not needed. Then, at times when the higher voltage of VPL is needed, the sense amplifier 310 may be configured (e.g., via switch 312) to set VPWR to VPL. For example, VPL may be needed to write (e.g., in a write-back or memory refresh) a "1" to the state-programmable memory element. Thus, VPWR may be set to VPL during a write operation. At other times, the VPWR may remain at VDD. When VPWR is set to VDD, the protection provided by the cascoding is no longer needed, so VCASCP may be biased to ground (e.g., via switch 314) and VCASCN may be tied to VDD (e.g., via switch 316). As discussed earlier, when VPWR is set to VPL, cascoding may be needed to protect the low-voltage transistors, so VCASCP may be biased to BIAS_P (e.g., via switch 314) and VCASCN may be tied to BIAS_N (e.g., via switch 316).

During a write operation (e.g., in a write-back operation) to write "0" to the state-programmable memory element, it may be the case that the sense amplifier 310 need not supply VPL on the bit line, because the bit line may remain at ground while the PL is biased to VPL in order to bias the state-programmable memory element to +VPL. Thus, VPWR may remain at VDD when writing a "0" in a write operation (e.g., in a write-back operation), which happens during the data-in of the "0" inside the latch of the sense amplifier and may be switched to VPL when needed to write a "1." Keeping VPWR at VDD may make the data-in operation (e.g., the data-in operation over LIO/LIOb, discussed above) more time-efficient, where the full swing from ground to VDD provides for faster charging/discharging over the transistors.

In general, sense amplifier 310 may operate with VPWR at VDD during the entire read operation, where it is not necessary to simultaneously write-back the read state. For example, the write-back operation may be timed to occur in a successive phase after the read-operation has completed. Then, in the write-back phase, the VPWR may be switched to VPL (e.g., by enabling the TOHIGH signal that controls switches 312, 314, and 316). In addition, the VPWR may be switched to VPL (e.g., only) in situations where the state to be written in the write-back phase is a "1."

Figure 4:
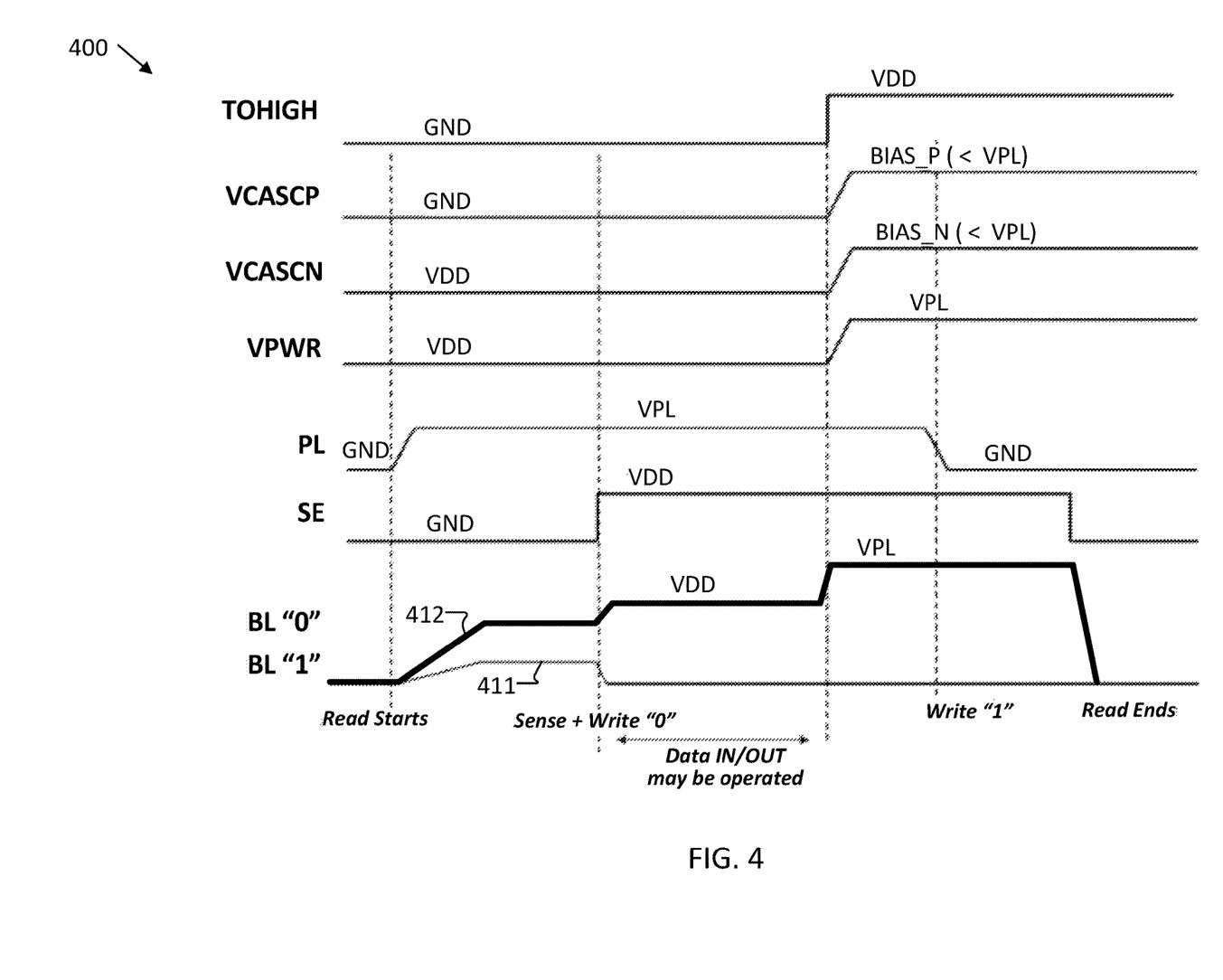
FIG. 4 shows exemplary timing diagram for performing a read operation and a write operation on a state-programmable memory element connected to the sense amplifier of FIG. 3.

FIG. 4 shows an example timing diagram 400 of how a sense amplifier discussed above (e.g., sense amplifier 210, 310) may be controlled to switch its power supply so as to operate at VDD during the read operation and then operate at VPL during the write-back operation. In particular, when operating at VPL during the write-back operation, the configuration of sense amplifier 310 shown in FIG. 3 protects the transistors from having a voltage across any individual transistor (e.g., from drain to source or from gate to drain/source) that is as high as VPL. For example, the read operation starts with TOHIGH disabled so that VPWR is set to VDD, VCASCP is set to ground, and VCASCN is set to VDD (e.g., via switches 312, 314, and 316). The BL is discharged to ground. Then, the programming voltage is applied to the state-programmable memory element by raising the PL to VPL while the BL is at ground. As should be understood and as discussed above, because a voltage of +VPL is applied across the state-programmable memory element, it is programmed (or re-programmed) to a "0" and a switching charge is generated that depends on the originally programmed state of the state-programmable memory element at the start of the read operation. If the programmed state of the state-programmable memory element was "0" at the start of the read operation, little to no switching charge is provided from the state-programmable memory element. If the programmed state of the state-programmable memory element was "1" at the start of the read operation, a non-zero switching charge is provided from the state-programmable memory element.

Once the switching charge has developed on the BL, the SE line is enabled (e.g., set to VDD), which raises BL to VDD in the case that the programmed state of the state-programmable memory element was "1." Or, if the programmed state of the state-programmable memory element was "0," the BL falls to GND. Note that in FIG. 4, the voltage on the BL is shown for two different cases using two different lines, where the thicker black line 412 shows the case where the programmed state of the state-programmable memory element was "1" at the start of the read operation. The thinner black line 411 shows the case where the programmed state of the state-programmable memory element was "0" at the start of the read operation.

After SE has been enabled, the sense amplifier may perform a data-in operation or a data-out operation (e.g., on the LIO/LIOb lines using YSW, as discussed above). Next, the write-back operation may begin by enabling TOHIGH to set VPWR to VPL, VCASCP to BIAS_P, and VCASCN to BIAS_N (e.g., via switches 312, 314, 316), where BIAS_P and BIAS_N may be a value between ground and VPL. This sets the BL to, in the case that the programmed state of the state-programmable memory element was "1" at the start of the read operation (or was switched to a "1" during the data-in operation), VPL such that when the PL is set to GND, the voltage across the state-programmable memory element is −VPL, which is sufficient to write-back the "1" state. In the case that the programmed state of the state-programmable memory element was "0" at the start of the read operation (or was switched to a "0" during the data-in operation), the BL will remain at ground and the PL will remain at VPL such that the voltage across the state-programmable memory element will be +VPL, which is sufficient to write-back the "0" state. At the end of the write-back operation, the SE is set to GND and the BL is discharged back to GND.

Figure 5:
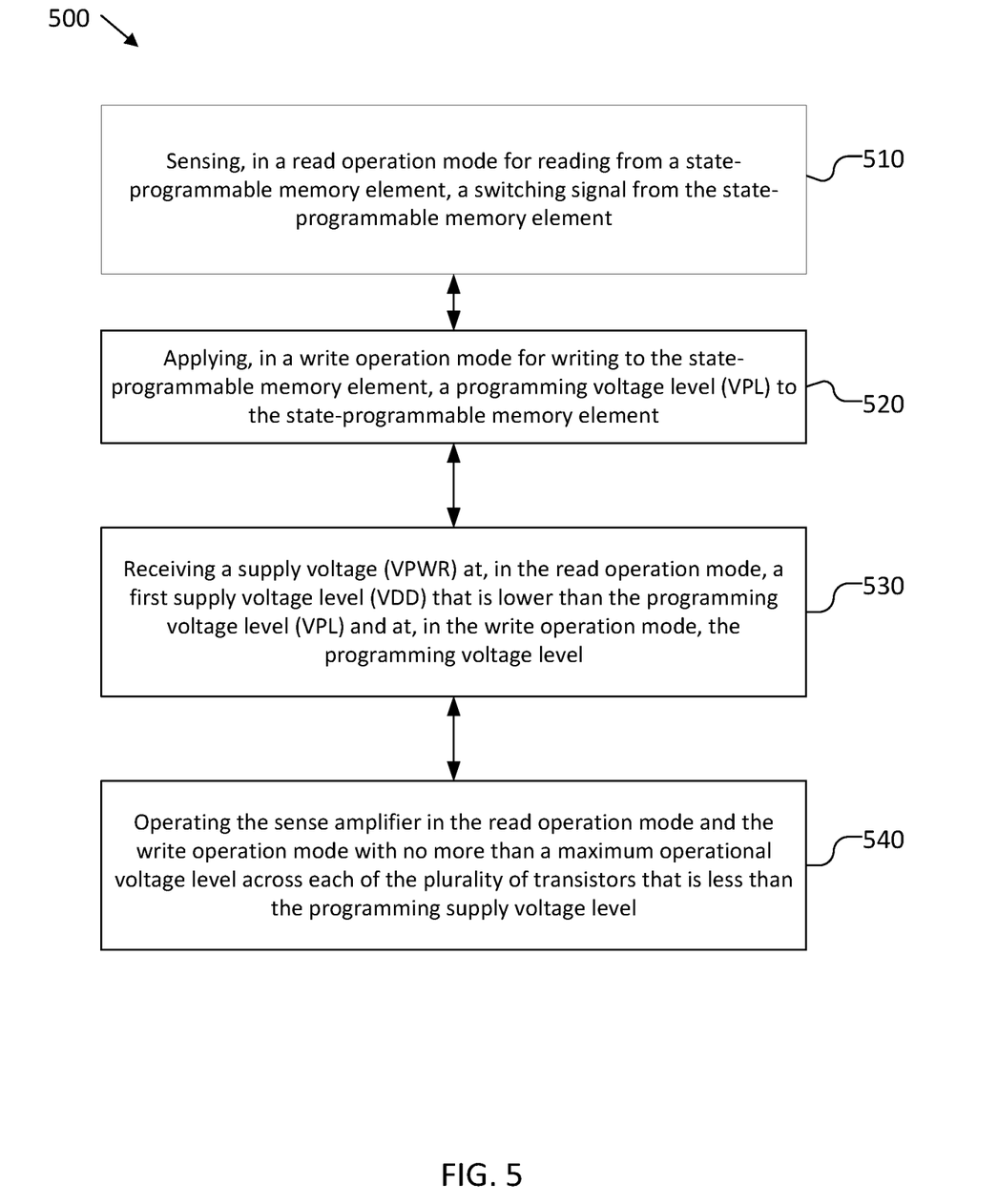
FIG. 5 depicts an exemplary schematic flow diagram of a method for operating a sense amplifier connected to a state-programmable memory element during, for example, a read operation and a write operation.

FIG. 5 depicts an exemplary schematic flow diagram of a method 500 for controlling a sense amplifier. Method 500 may implement any of the features and/or structures described above with respect to the sense amplifier and associated circuits described above with respect to FIGS. 1-4.

Method 500 includes, in 510, sensing, in a read operation mode for reading from a state-programmable memory element, a switching signal from the state-programmable memory element. Method 500 includes, in 520, applying, in a write operation mode for writing to the state-programmable memory element, a programming voltage level to the state-programmable memory element. Method 500 includes, in 530, receiving a supply voltage at, in the read operation mode, a first supply voltage level that is lower than the programming voltage level and at, in the write operation mode, the programming voltage level. Method 500 includes, in 540, operating the sense amplifier in the read operation mode and the write operation mode with no more than a maximum operational voltage level across each of the plurality of transistors that is less than the programming supply voltage level.

In the following, various examples are provided that may include one or more aspects described above with reference to a multilevel state-programmable memory element. It may be intended that aspects described in relation to the circuits may apply also to the described method(s), and vice versa.

Example 1 is a sense amplifier including a plurality of transistors connected in a cascode configuration. The plurality of transistors are configured to sense, in a read operation mode for reading from a state-programmable memory element, a switching signal from the state-programmable memory element. The plurality of transistors are configured to apply, in a write operation mode for writing to the state-programmable memory element, a programming voltage level (VPL) to the state-programmable memory element. The plurality of transistors are configured to receive a supply voltage (VPWR) at, in the read operation mode, a first supply voltage level (VDD) that is lower than the programming voltage level (VPL) and at, in the write operation mode, the programming voltage level. The plurality of transistors are configured to operate in the read operation mode and the write operation mode with no more than a maximum operational voltage level across each of the plurality of transistors that is less than the programming voltage level.

Example 2 is the sense amplifier of example 1, wherein the plurality of transistors are configured to receive the supply voltage (VPWR) from a control circuit configured to select, based on a voltage selection control signal, the supply voltage from among the first supply voltage level (VDD) and the programming voltage level (VPL).

Example 3 is the sense amplifier of any of examples 1 to 2, wherein the plurality of transistors are configured to receive a first intermediate supply voltage (VCASCP) at, in the read operation mode, a ground voltage level (GND) and at, in the write operation mode, a first bias voltage level (BIAS_P) that is lower than or equal to the programming voltage level (VPL).

Example 4 is the sense amplifier of example 3, wherein the plurality of transistors are configured to receive a second intermediate supply voltage (VCASCN) at, in the read operation mode, the first supply voltage level (VDD) and at, in the write operation mode, a second bias voltage level (BIAS_N) that is lower than or equal to the programming voltage level (VPL).

Example 5 is the sense amplifier of example 4, wherein the plurality of transistors are configured to receive the first intermediate supply voltage (VCASCP) and/or the second intermediate supply voltage (VCASCN) from a control circuit configured to select, based on a voltage selection control signal, the first intermediate supply voltage (VCASCP) from among the ground voltage level (GND) and the first bias voltage level (BIAS_P) and/or select, based on the voltage selection control signal, the second intermediate supply voltage (VCASCN) from among the first supply voltage level (VDD) and the second bias voltage level (BIAS_N).

Example 6 is the sense amplifier of any of examples 4 to 5, wherein the voltage selection control signal includes an indication from a memory controller as to whether the sense amplifier is to operate in the read operation mode or the write operation mode.

Example 7 is the sense amplifier of any of examples 1 to 6, wherein the sense amplifier configured to sense the switching signal from the state-programmable memory element includes the sense amplifier configured to sense the switching signal on a bit line connected to the sense amplifier, wherein the bit line is also connected to the state-programmable memory element.

Example 8 is the sense amplifier of any of examples 1 to 7, wherein the sense amplifier configured to apply the programming voltage level (VPL) to the state-programmable memory element includes the sense amplifier configured to apply the programming voltage level to a bit line connected to the sense amplifier, wherein the bit line is also connected to the state-programmable memory element.

Example 9 is the sense amplifier of any of examples 1 to 8, wherein each transistor of the plurality of transistors includes a gate terminal, a first drain/source terminal and a second drain/source terminal, wherein the maximum operational voltage level across a transistor of the plurality of transistors includes a maximum gate-source voltage level defined between the gate terminal and the first drain/source terminal, a maximum gate-drain voltage level defined between the gate terminal and the second drain/source terminal, and a maximum source-drain voltage level defined between the first drain/source terminal and the second drain/source terminal.

Example 10 is the sense amplifier of any of examples 1 to 9, wherein the switching signal is received from the state-programmable memory element when, in the read operation mode, the programming voltage level is provided across the state-programmable memory element.

Example 11 is the sense amplifier of example 10, wherein the sense amplifier configured to sense the switching signal includes the sense amplifier configured to sense the switching signal on a bit line connected to the state-programmable memory element, wherein the sense amplifier configured to apply the programming voltage level includes the sense amplifier configured to sense the switching signal on the bit line.

Example 12 is the sense amplifier of example 11, wherein the state-programmable memory element is connected to the bit line at a first terminal of the state-programmable memory element, wherein a second terminal of the state-programmable memory element is connected to a plate line.

Example 13 is the sense amplifier of any of examples 1 to 12, wherein the cascode configuration includes a differential cascode configuration.

Example 14 is the sense amplifier of example 13, wherein the differential cascode configuration includes pair of differential terminals of the plurality of transistors, wherein the plurality of transistors are configured to sense the switching signal from the state-programmable memory element and to apply the programming voltage level to the state-programmable memory element at one terminal of the pair of differential terminals, wherein the other terminal of the pair of differential terminals is a reference terminal with respect to a different state-programmable memory element.

Example 15 is the sense amplifier of any of examples 1 to 14, wherein the state-programmable memory element includes a ferroelectric capacitor that is programmable to at least two different remanent polarization states of the ferroelectric capacitor.

Example 16 is the sense amplifier of any of examples 1 to 15, wherein the plurality of transistors are configured to receive a data value for reading-in from or reading-out to the state-programmable memory element, wherein the data value represents a logic bit that has been stored or is to be stored by the state-programmable memory element.

Example 17 is the sense amplifier of example 16, wherein the logic bit includes either a first logic value or a second logic value, each of which corresponds to a different remanent state of the state-programmable memory element.

Example 18 is a method of operating a sense amplifier including a plurality of transistors connected in a cascode configuration, the method including sensing, in a read operation mode for reading from a state-programmable memory element, a switching signal from the state-programmable memory element. The method also includes applying, in a write operation mode for writing to the state-programmable memory element, a programming voltage level (VPL) to the state-programmable memory element. The method also includes receiving a supply voltage (VPWR) at, in the read operation mode, a first supply voltage level (VDD) that is lower than the programming voltage level (VPL) and at, in the write operation mode, the programming voltage level. The method also includes operating the sense amplifier in the read operation mode and the write operation mode with no more than a maximum operational voltage level across each of the plurality of transistors that is less than the programming voltage level.

Example 19 is the method of example 18, the method further including receiving a first intermediate voltage (VCASCP) at, in the read operation mode, a ground voltage level (GND) and at, in the write operation mode, a first bias voltage level (BIAS_P) that is lower than or equal to the programming voltage level (VPL).

Example 20 is the method of example 19, the method further including receiving a second intermediate voltage (VCASCN) at, in the read operation mode, the first supply voltage level (VDD) and at, in the write operation mode, a second bias voltage level (BIAS_N) that is lower than or equal to the programming voltage level (VPL).

Example 21 is a memory that includes a memory cell and a sense amplifier connected to the memory cell, wherein the sense amplifier includes a plurality of transistors connected in a cascode configuration that are configurable between a read operation mode for reading from the memory cell and a write operation mode for writing to the memory cell. The memory also includes a memory controller configured to configure the sense amplifier to the read operation mode or the write operation mode, wherein in the read operation mode, the plurality of transistors are configured to sense, in a read operation mode for reading from the memory cell, a switching signal received from the memory; and receive a supply voltage (VPWR) at a first supply voltage level (VDD). In the write operation mode for writing to the memory cell, the plurality of transistors are configured to apply a programming voltage level (VPL) to the memory cell and receive the supply voltage (VPWR) at a programming voltage level (VPL) that is that is higher than the first supply voltage level (VDD). In the read operation mode and the write operation mode, the plurality of transistors are configured to operate with no more than a maximum operational voltage level across each of the plurality of transistors that is less than the programming voltage level (VPL).

Example 25 is a memory including a state-programmable memory element that is programmable to one of two different remanent states based on whether a programming voltage is applied across the state programmable memory element. The memory also includes a sense amplifier including a supply voltage node configured to receive a supply voltage configurable between two different voltage levels based on an operation mode of the memory with respect to the state-programmable memory element. The sense amplifier also includes a sensing voltage node connected to the state-programmable memory element, the sensing voltage node configured to, when the operation mode is a read operation, set the supply voltage to one of the two different voltage levels and to, when the operation mode is a write operation, set the supply voltage to a different one of the two different voltage levels. The sense amplifier also includes a plurality of transistors configured to operate with no more than a maximum operational voltage across each of the plurality of transistors, wherein the maximum operational voltage is less than the programming voltage.

Example 26 is the memory of example 25, the memory further including a control circuit configured to select, based on a voltage selection control signal (e.g., from a memory controller), the supply voltage from among the two different voltage levels.

Example 27 is the memory of example 26, wherein the control circuit is further configured to select, based on the voltage selection control signal, an intermediate voltage of the sense amplifier from among a ground voltage level and a transistor bias level, wherein the transistor bias level is higher than the ground level and lower than the programming voltage level (VPL).

Example 28 is the memory of either of examples 26 or 27, wherein the control circuit is further configured to select, based on the voltage selection control signal, a second intermediate voltage of the sense amplifier from among a first supply voltage level (VDD) and a second transistor bias level, wherein the second transistor bias level is higher than the ground level and lower than the programming voltage level (VPL).

Example 29 is the memory of any one of examples 26 to 28, wherein the voltage selection control signal includes an indication of whether the operation mode is the read operation or the write operation.

Example 30 is the memory of any one of examples 25 to 29, wherein the sensing voltage node includes a bit line of the memory connected to the state programmable memory element.

Example 31 is the memory of any one of examples 25 to 30, wherein each transistor of the plurality of transistors includes a gate terminal, a first drain/source terminal and a second drain/source terminal, wherein the maximum operational voltage across a transistor of the plurality of transistors includes a maximum gate-source voltage defined between the gate terminal and the first drain/source, a maximum gate-drain voltage defined between the gate terminal and the second drain/source terminal, and a maximum source-drain voltage defined between the first drain/source terminal and the second drain/source terminal.

Example 32 is the memory of any one of examples 25 to 31, wherein the sense amplifier is configured to receive at the sensing voltage node a switching charge that is based on a programmed state of the state-programmable memory element before the read operation.

Example 33 is the memory of example 32, wherein the sense amplifier is configured to set, when the operation mode is the read operation, the sensing voltage node to a logic high level or a ground level based on the switching charge associated with the programmed state, and receive, when the operation mode is the write operation, the programming voltage at the sensing voltage node.

Example 34 is the memory of example 33, wherein the programming voltage is higher than the logic high level.

Example 35 is the memory of any one of examples 25 to 34, wherein the two different remanent states include at least two distinct polarization states.

Example 36 is the memory of example 35, wherein the at least two distinct polarization states include one positive remanent polarization state and one negative remanent polarization state of the state-programmable memory element.

Example 37 is the memory of any one of examples 25 to 36, wherein when the operation mode is the write operation, the supply voltage is set to the programming voltage as the one of the two different voltage levels.

Example 38 is the memory of any one of examples 25 to 37, wherein the two different voltage levels include the programming voltage and a transistor supply voltage level for operating the plurality of transistors (VDD), wherein when the operation mode is the read operation, a control circuit is configured to select the transistor supply voltage level as the supply voltage and when the operation mode is the write operation, the control circuit is configured to select the programming voltage as the supply voltage.

Example 39 is the memory of any one of examples 25 to 38, wherein the sensing voltage node is connected to a first terminal of the state-programmable memory element on a bit line of the memory, wherein a second terminal of the state-programmable memory element is connected to a plate line of the memory.

Example 40 is the memory of any one of examples 25 to 39, wherein the memory includes a plurality of state-programmable memory elements that are connected to the bit line and the plate line, wherein the state-programmable memory element is one of the plurality of state-programmable memory elements.

Example 41 is the memory of any one of examples 25 to 40, wherein the state-programmable memory element includes a ferroelectric capacitor.

Example 42 is the memory of example 41, wherein the two different remanent states include two different remanent polarization states of the ferroelectric capacitor.

Example 43 is the memory of any one of examples 25 to 42, wherein the two different voltage levels include the programming voltage and a transistor supply voltage level for operating the transistors (VDD).

Example 44 is the memory of any one of examples 25 to 43, the sense circuit further including a data line for reading-in or reading-out a data value, wherein the data value represents a logic bit that has been stored or is to be stored by the state-programmable memory element.

Example 45 is the memory of example 44, wherein the logic bit includes either a first logic value or a second logic value, each of which corresponds to a different one of the two different remanent states of the state-programmable memory element.

Example 46 is a method of operating a sense amplifier, the method including setting, during a read operation, a voltage level on a bit line of a memory, wherein the set voltage level is based on which of two different remanent states a state-programmable memory element has been programmed, wherein the sense amplifier is connect to the bit line. The method also includes setting, during a write operation, the bit line to a programming voltage that is sufficient to program the state-programmable memory element to one of two different remanent states. The method also includes operating a plurality of low-voltage transistors of the sense amplifier with no more than a maximum operational voltage across each of the plurality of transistors, wherein the maximum operational voltage remains less than the programming voltage by: selecting a supply voltage for the sense amplifier from among the programming voltage and a transistor supply voltage, wherein if the operating is during the read operation on the state-programmable memory element, the selected supply voltage is the transistor supply voltage and if the operating is during the write operation on the state-programmable memory element, the selected supply voltage is the programming voltage; and selecting an intermediate voltage for the sense amplifier from among a ground level and a bias voltage that is lower than the programming voltage, wherein if the operating is during the read operation on the state-programmable memory element, the selected intermediate voltage is the ground level and if the operating is during the write operation on the state-programmable memory element, the selected intermediate voltage is the bias voltage.

Example 47 is the method of example 46, the method further including selecting a second intermediate voltage (VCASCN) for the sense amplifier from among the first supply voltage level (VDD) and a second bias voltage level (BIAS_N) that is lower than or equal to the programming voltage (VPL), wherein if the operating is during the read operation on the state-programmable memory element, the selected second intermediate voltage is the first supply voltage level and if the operating is during the write operation on the state-programmable memory element, the selected second intermediate voltage is the second bias voltage level.

The terms "at least one" and "one or more" may be understood to include any integer number greater than or equal to one, i.e. one, two, three, four, [ . . . ], etc is the term "a plurality" or "a multiplicity" may be understood to include any integer number greater than or equal to two, i.e. two, three, four, five, [ . . . ], etc is the phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

The invention claimed is:

1. A sense amplifier comprising a plurality of transistors connected in a cascode configuration, the plurality of transistors configured to:
   sense, in a read operation mode for reading from a state-programmable memory element, a switching signal from the state-programmable memory element;
   apply, in a write operation mode for writing to the state-programmable memory element, a programming voltage level to the state-programmable memory element;
   receive a supply voltage at, in the read operation mode, a first supply voltage level that is lower than the programming voltage level and at, in the write operation mode, the programming voltage level; and
   operate in the read operation mode and the write operation mode with no more than a maximum operational voltage level across each of the plurality of transistors that is less than the programming voltage level.

2. The sense amplifier of claim 1, wherein the plurality of transistors are configured to receive the supply voltage from a control circuit configured to select, based on a voltage selection control signal, the supply voltage from among the first supply voltage level and the programming voltage level.

3. The sense amplifier of claim 2, wherein the voltage selection control signal comprises an indication from a memory controller as to whether the sense amplifier is to operate in the read operation mode or the write operation mode.

4. The sense amplifier of claim 1, wherein the plurality of transistors are configured to receive a first intermediate supply voltage at, in the read operation mode, a ground voltage level and at, in the write operation mode, a first bias voltage level that is lower than or equal to the programming voltage level.

5. The sense amplifier of claim 4, wherein the plurality of transistors are configured to receive a second intermediate supply voltage at, in the read operation mode, the first supply voltage level and at, in the write operation mode, a second bias voltage level that is lower than or equal to the programming voltage level.

6. The sense amplifier of claim 5, wherein the plurality of transistors are configured to receive the first intermediate supply voltage and/or the second intermediate supply voltage from a control circuit configured to:
   select, based on a voltage selection control signal, the first intermediate supply voltage from among the ground voltage level and the first bias voltage level; and/or select, based on the voltage selection control signal, the second intermediate supply voltage from among the first supply voltage level and the second bias voltage level.

7. The sense amplifier of claim 1, wherein the sense amplifier configured to sense the switching signal from the state-programmable memory element comprises the sense amplifier configured to sense the switching signal on a bit line connected to the sense amplifier, wherein the bit line is also connected to the state-programmable memory element.

8. The sense amplifier of claim 1, wherein the sense amplifier configured to apply the programming voltage level to the state-programmable memory element comprises the sense amplifier configured to apply the programming voltage level to a bit line connected to the sense amplifier, wherein the bit line is also connected to the state-programmable memory element.

9. The sense amplifier of claim 1, wherein each transistor of the plurality of transistors comprises a gate terminal, a first drain/source terminal and a second drain/source terminal, wherein the maximum operational voltage level across a transistor of the plurality of transistors comprises a maximum gate-source voltage level defined between the gate terminal and the first drain/source terminal, a maximum gate-drain voltage level defined between the gate terminal and the second drain/source terminal, and a maximum source-drain voltage level defined between the first drain/source terminal and the second drain/source terminal.

10. The sense amplifier of claim 1, wherein the switching signal is received from the state-programmable memory element when, in the read operation mode, the programming voltage level is provided across the state-programmable memory element.

11. The sense amplifier of claim 10, wherein the sense amplifier configured to sense the switching signal comprises the sense amplifier configured to sense the switching signal on a bit line connected to the state-programmable memory element, wherein the sense amplifier configured to apply the programming voltage level comprises the sense amplifier configured to sense the switching signal on the bit line.

12. The sense amplifier of claim 11, wherein the state-programmable memory element is connected to the bit line at a first terminal of the state-programmable memory element, wherein a second terminal of the state-programmable memory element is connected to a plate line.

13. The sense amplifier of claim 1, wherein the cascode configuration comprises a differential cascode configuration.

14. The sense amplifier of claim 13, wherein the differential cascode configuration comprises a pair of differential terminals of the plurality of transistors, wherein the plurality of transistors are configured to sense the switching signal from the state-programmable memory element and to apply the programming voltage level to the state-programmable memory element at one terminal of the pair of differential terminals, wherein the other terminal of the pair of differential terminals is a reference terminal with respect to a different state-programmable memory element.

15. The sense amplifier of claim 1, wherein the state-programmable memory element comprises a ferroelectric capacitor that is programmable to at least two different remanent polarization states of the ferroelectric capacitor.

16. The sense amplifier of claim 1, wherein the plurality of transistors are configured to receive a data value for reading-in from or reading-out to the state-programmable memory element, wherein the data value represents a logic bit that has been stored or is to be stored by the state-programmable memory element.

17. The sense amplifier of claim 16, wherein the logic bit comprises either a first logic value or a second logic value, each of which corresponds to a different remanent state of the state-programmable memory element.

18. A method of operating a sense amplifier comprising a plurality of transistors connected in a cascode configuration, the method comprising:
sensing, in a read operation mode for reading from a state-programmable memory element, a switching signal from the state-programmable memory element;
applying, in a write operation mode for writing to the state-programmable memory element, a programming voltage level to the state-programmable memory element;
receiving a supply voltage at, in the read operation mode, a first supply voltage level that is lower than the programming voltage level and at, in the write operation mode, the programming voltage level; and
operating the sense amplifier in the read operation mode and the write operation mode with no more than a maximum operational voltage level across each of the plurality of transistors that is less than the programming voltage level.

19. The method of claim 18, the method further comprising:
receiving a first intermediate voltage at, in the read operation mode, a ground voltage level and at, in the write operation mode, a first bias voltage level that is lower than or equal to the programming voltage level; and
receiving a second intermediate voltage at, in the read operation mode, the first supply voltage level and at, in the write operation mode, a second bias voltage level that is lower than or equal to the programming voltage level.

20. A memory comprising:
a memory cell;
a sense amplifier connected to the memory cell, wherein the sense amplifier comprises a plurality of transistors connected in a cascode configuration that are configurable between a read operation mode for reading from the memory cell and a write operation mode for writing to the memory cell; and
a memory controller configured to configure the sense amplifier to the read operation mode or the write operation mode, wherein in the read operation mode, the plurality of transistors are configured to:
sense, in a read operation mode for reading from the memory cell, a switching signal received from the memory; and
receive a supply voltage at a first supply voltage level,
wherein in the write operation mode for writing to the memory cell, the plurality of transistors are configured to:
apply a programming voltage level to the memory cell; and
receive the supply voltage at a programming voltage level that is that is higher than the first supply voltage level,
where in the read operation mode and the write operation mode, the plurality of transistors are configured to operate with no more than a maximum operational voltage level across each of the plurality of transistors that is less than the programming voltage level.

* * * * *